US008243964B2

(12) United States Patent
Eaton

(10) Patent No.: US 8,243,964 B2
(45) Date of Patent: Aug. 14, 2012

(54) PIEZO SPEAKER PRESSURE SENSOR

(75) Inventor: William Chris Eaton, Cary, NC (US)

(73) Assignee: Sony Mobile Communications AB, Lund (SE)

( * ) Notice: Subject to any disclaimer, the term of this patent is extended or adjusted under 35 U.S.C. 154(b) by 1219 days.

(21) Appl. No.: 12/030,535

(22) Filed: Feb. 13, 2008

(65) Prior Publication Data

US 2009/0202090 A1 Aug. 13, 2009

(51) Int. Cl.

*H04R 25/00* (2006.01)
*H01L 29/84* (2006.01)
*H01L 21/00* (2006.01)

(52) U.S. Cl. ........ 381/190; 257/254; 257/415; 257/416; 438/53

(58) Field of Classification Search .................. 381/190, 381/173; 73/715-754; 438/50, 53; 257/254, 257/415, 416

See application file for complete search history.

(56) References Cited

U.S. PATENT DOCUMENTS

2002/0026226 A1* 2/2002 Ein .............................. 607/108
2006/0288793 A1 12/2006 Tanaka
2007/0058827 A1* 3/2007 Topliss .......................... 381/190
2008/0025533 A1* 1/2008 Livingstone et al. ......... 381/190

FOREIGN PATENT DOCUMENTS

DE 202007002778 U1 4/2007
EP 1492314 A2 12/2004
KR 20030090272 A 11/2003

OTHER PUBLICATIONS

Patent Cooperation Treaty, International Preliminary Report on Patentability, Jan. 27, 2010.

* cited by examiner

*Primary Examiner* — Mohsen Ahmadi
*Assistant Examiner* — Calvin Choi
(74) *Attorney, Agent, or Firm* — Sreenivas Vedantam; Moore & Van Allen

(57) ABSTRACT

A piezo speaker pressure sensor that includes a bladder and a piezo speaker element. The bladder abuts the piezo speaker element. A pressure may be sensed from the piezo speaker element proportional to a pressure exerted on the bladder in a direction of the piezo speaker element. The piezo speaker element functions as a speaker when audio signals are received by the piezo speaker element.

18 Claims, 3 Drawing Sheets

PIEZO SPEAKER PRESSURE SENSOR

BACKGROUND OF THE INVENTION

The present invention is related to piezo devices, and more specifically to a piezo speaker pressure sensor.

Components in portable devices and other electronic devices are increasingly shrinking in size. Due to this reduction is size, space has become a valued item in order to provide portable devices in increasingly smaller sizes. Different functions, components, and input devices desired to be incorporated into a device each have an associated size. This size may prevent all of the desired functions, components, input devices, etc. desired to be incorporated into a device from being implemented based on a difficulty to integrate.

BRIEF SUMMARY OF THE INVENTION

According to one aspect of the present invention, a piezo speaker pressure sensor includes a bladder and a piezo speaker element, the bladder abutting the piezo speaker element, wherein a pressure may be sensed from the piezo speaker element proportional to a pressure exerted on the bladder in a direction of the piezo speaker element, the piezo speaker element functioning as a speaker when audio signals are received by the piezo speaker element According to another aspect of the present invention, a piezo speaker pressure sensor includes a bladder, a piezo speaker element, and a gap between the bladder and the piezo speaker element, the bladder abutting the piezo speaker element, wherein a pressure may be sensed from the piezo speaker element proportional to a pressure exerted on the bladder in a direction of the piezo speaker element, the piezo speaker element functioning as a speaker when audio signals are received by the piezo speaker element.

According to a further aspect of the present invention, a portable device includes a piezo speaker pressure sensor, the piezo speaker pressure sensor including: a bladder and a piezo speaker element, the bladder abutting the piezo speaker element forming an airtight seal, a processor, the processor sensing a pressure proportional to a pressure exerted on the bladder in a direction of the piezo speaker element, and an amplifier, the piezo speaker element functioning as a speaker when audio signals are received by the piezo speaker element from the amplifier.

BRIEF DESCRIPTION OF THE DRAWINGS

The present invention is further described in the detailed description which follows in reference to the noted plurality of drawings by way of non-limiting examples of embodiments of the present invention in which like reference numerals represent similar parts throughout the several views of the drawings and wherein.

DETAILED DESCRIPTION OF THE INVENTION

Figure 1:
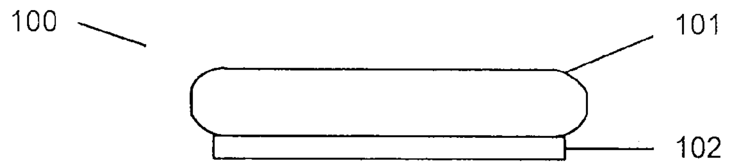
FIG. 1 is a diagram of a piezo speaker pressure sensor according to an example embodiment of the present invention.

As will be appreciated by one of skill in the art, the present invention may be embodied as a method, system, apparatus, or a combination of the foregoing.

Embodiments according to the present invention provide a piezo speaker pressure sensor that has a dual use as a speaker and a pressure sensor. A piezo speaker pressure sensor according to embodiments of the present invention may include a piezo speaker element attached to a baffle. The bladder may be composed of any type of pliable material, for example, rubber, plastic, latex, etc. Due to the piezo electric effect, the piezo speaker element may be composed of a piezo material that provides a voltage when displaced. A sensor may be used to detect these electrical signals and determine an associated pressure proportional to the force exerted on the bladder. An audio signal applied to the piezo speaker element may cause the piezo speaker element to act as a speaker. The speaker's output may be used as either an analog or digital signal indicator. Thus, according to embodiments of the present invention, a piezo speaker element and bladder combination may be used as a tactile input device in a speaker.

According to embodiments of the present invention, a hollow five sided bladder in contact with a piezo speaker element may be used as a speaker box with a sealed back volume for the piezo speaker element. Further, a sealed bladder in contact with the piezo speaker element may be used to control a force applied to the bladder in a direction of the piezo speaker element where when force is applied, the piezo speaker element may deflect in proportion to deflection of the bladder. This deflection may produce electrical signals used to detect an associated pressure related to the applied force.

As noted previously, the bladder may provide protection for the piezo speaker element from the force being applied. When force is applied, the piezo speaker element may deflect proportional to deflection of the bladder but not to the same degree as the bladder since material inside the bladder (e.g., air) is compressed. If air is used inside the bladder, air may be added or released to control onset of deflection and amount. Thus, the bladder may limit deflection in direct contact with the piezo speaker element, which may be fragile. Further, a sealed or mostly sealed back volume of the bladder may be used to improve frequency response of the speaker system. The addition or removal of air from the bladder may also be used to tune the speaker and eliminate possible cancellation between front and back waves emitted from the speaker. Therefore, according to embodiments of the present invention, the bladder may serve as an acoustic back volume that may be used to separate the pressure wave from the front of the speaker from the rear and increase the compliance of the assembly thereby improving the frequency response and lowering distortion.

A piezo speaker pressure sensor according to embodiments of the present invention may be used as an input device to a portable device or any other type of device to sense a pressure being applied. For example, a piezo speaker pressure sensor may be used as a pressure sensitive input for performing the function of a scale, on/off device, light intensity control, audio volume control, or used as a pressure sensitive input for electronic games or other functions. In light intensity control or audio volume control embodiments, increased pressure may be translated into an increased light intensity or an increased audio volume. Once a maximum light intensity or a maximum audio volume level has been reached, additional pressure may recycle the light intensity to an off state or a minimum light intensity and/or similarly cycle the audio volume to an off state or a minimum audio volume level.

In a gaming embodiment, a piezo speaker pressure sensor may serve as a pressure sensitive input where an amount of force applied may be used to determine, for example, how fast a punch is thrown in a game, how fast an item moves in a game, how high or low an item moves in a game, etc. Further, in a scale embodiment according to the present invention, a piezo speaker pressure sensor may be used as a scale to measure weight where once measured, this value may be stored and then the piezo speaker pressure sensor provide an audio output of the measured amount.

Moreover, according to embodiments of the present invention, a bladder may be directly abutted against the piezo speaker element, or there may be a gap between the bladder and the piezo speaker element while the bladder is still attached to the piezo speaker element. In addition, according to embodiments of the present invention, the bladder may be filled with air or may be filled with any other type of material such as, for example, a liquid, a gas, a porous material, a spongy material, a springy material, an elastic material, a flexible material, a squishy material, etc. A bladder filled with air may directly abut the piezo speaker element forming an airtight seal. In addition, the bladder may be filled with other types of material (other than air) and abut the piezo speaker element. In addition, the bladder may be filled with air or any other material and not directly abut the piezo speaker element but have a gap between the bladder and the piezo speaker element.

FIG. 1 shows a diagram of a piezo speaker pressure sensor according to an example embodiment of the present invention. The piezo speaker pressure sensor 100 may include a bladder 101 that directly abuts against a piezo speaker element 102. The bladder 101 may be filled with air, gas or some other type material such as, for example, a liquid, a porous material, a spongy material, a springy material, an elastic material, a flexible material, or a squishy material. When a force is applied to the bladder 101 in a direction of the piezo speaker element 102, electrical signals may be generated from the piezo speaker element. An associated pressure proportional to the force applied may be detected from the electrical signals generated from the piezo speaker element 102. Further, if the piezo speaker element 102 receives audio signals, the piezo speaker element 102 acts as a speaker.

Figure 2:
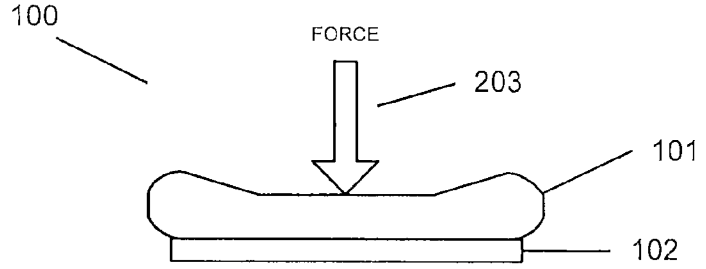
FIG. 2 is a piezo speaker pressure sensor with a force being applied according to an example embodiment of the present invention.

FIG. 2 shows a piezo speaker pressure sensor with a force being applied according to an example embodiment of the present invention. The piezo speaker pressure sensor 100 includes a bladder 101 and a piezo speaker element 102. In this embodiment, a force 203 is being applied to the bladder 101 in a direction of the piezo speaker element 102. When a force 203 is applied to the bladder 101, the bladder 101 may deform in response to the asserted pressure 203. A force may be exerted on the piezo speaker element 102 responsive to the force being asserted on the bladder 101 where the force on the piezo speaker element 102 may cause electrical signals to be generated from the piezo electric element 102. The electrical signals may be detected and processed to determine a pressure associated with the applied force 203.

Figure 3:
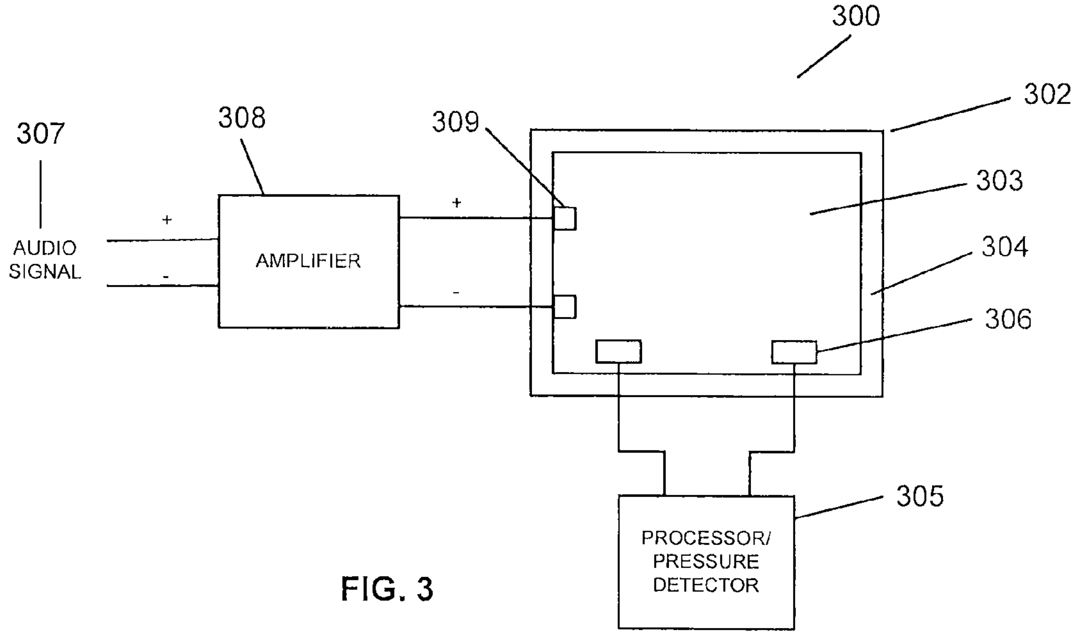
FIG. 3 is a diagram of a system for a piezo speaker pressure sensor according to an example embodiment of the present invention.

FIG. 3 shows a diagram of a system for a piezo speaker pressure sensor according to an example embodiment of the present invention. The system 300 may include a piezo speaker pressure sensor 302, a processor or pressure detector 305, and an amplifier 308. The amplifier 308 may receive and amplify an audio signal 307 and provide the amplified signal to the piezo speaker pressure sensor 302 through connections on the piezo speaker pressure sensor 309. The processor/pressure detector 305 may be connected to the piezo speaker pressure sensor 309 through one or more connections 306 on the piezo speaker pressure sensor 302 for detecting electrical signals related to a force being applied to a piezo speaker element 303 of the piezo speaker pressure sensor 302 via a bladder (not shown) of the piezo speaker pressure sensor 302. The piezo speaker element 303 may be bordered by a supporting structure 304. Therefore, according to embodiments of the present invention, when an audio signal 307 is received and amplified by an amplifier 308, it may then be fed to the piezo speaker element 303 causing the piezo speaker element 303 to act as a speaker for the received audio signal 307. Further, in response to a force being exerted on a bladder portion of the piezo speaker pressure sensor 302 (bladder not shown), electrical signals may be generated from the piezo speaker element 303 in proportion to the asserted force. The generated electrical signals may be detected by a processor or pressure detector 305 and a pressure associated with the asserted force may be determined.

Figure 4:
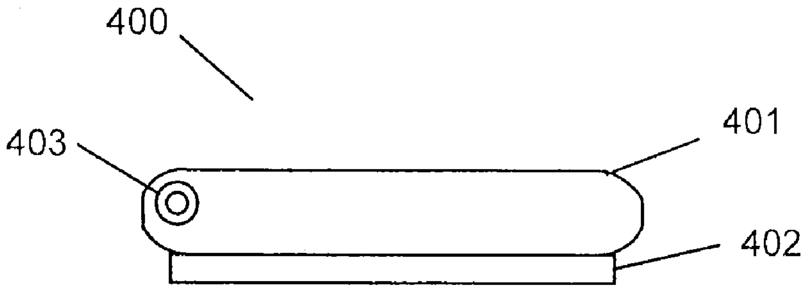
FIG. 4 is a diagram of a piezo speaker pressure sensor according to another example embodiment of the present invention.

FIG. 4 shows a diagram of a piezo speaker pressure sensor according to another example embodiment of the present invention. In this example embodiment, a piezo speaker pressure sensor 400 may include a bladder 401 abutted against a piezo speaker element 402. The bladder 401 may be filled with air or a gas and contain a valve 403 for inserting and removing air or gas from the bladder 401. Increasing or decreasing the amount of air or gas in the bladder may be used for tuning a resonant frequency of the piezo speaker element 402 or for controlling an amount of force transmitted to the piezo speaker element 402 when a force is exerted on the bladder 401.

Figure 5:
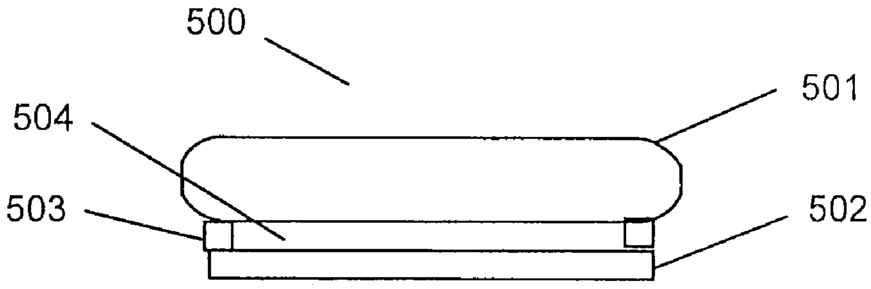
FIG. 5 is a diagram of a piezo speaker pressure sensor according to still another example embodiment of the present invention.

FIG. 5 shows a diagram of a piezo speaker pressure sensor according to still another example embodiment of the present invention. In this example embodiment, a piezo speaker pressure sensor 500 may include a bladder 501 connected to a piezo speaker element 502 via attachments 503 where there is a gap 504 between the bladder 501 and the piezo speaker element 502. The bladder 501 may be filled with air, gas or some other type material such as, for example, a liquid, a porous material, a spongy material, a springy material, an elastic material, a flexible material, or a squishy material. When a force is applied to the bladder 501 in a direction of the piezo speaker element 502, the force may cause the bladder to contact the piezo speaker element 502 thereby causing the piezo speaker element 502 to displace and produce electrical signals. The electrical signals from the piezo speaker element 502 may be used to detect a pressure associated with the applied force.

Figure 6:
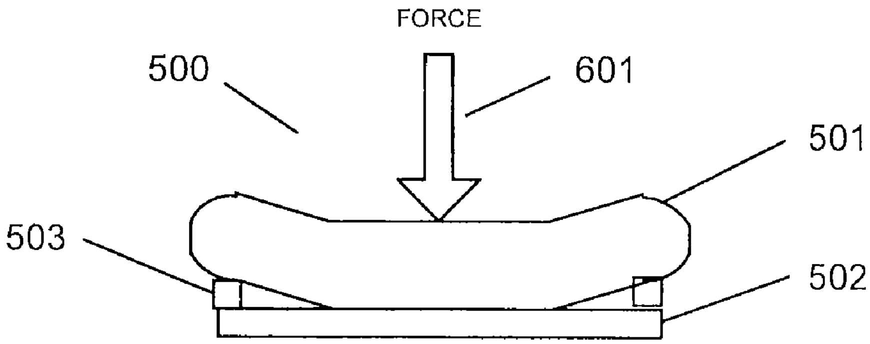
FIG. 6 is a diagram of the piezo speaker pressure sensor shown in FIG. 5 after a force has been asserted according to an example embodiment of the present invention.

FIG. 6 shows a diagram of the piezo speaker pressure sensor shown in FIG. 5 after a force has been asserted according to an example embodiment of the present invention. As shown in the Figure, when a force 601 is applied to the bladder 501 of the piezo speaker pressure sensor 500 in a direction of the piezo speaker element 502, the bladder 501 may transmit the force to the piezo speaker element 502 by deforming and contacting the piezo speaker element 502. As noted previously, this may cause displacement of the piezo speaker element 502 causing electrical signals to be generated from the piezo speaker element 502. The electrical signals may be used to detect a pressure associated with the applied force 601.

Figure 7:
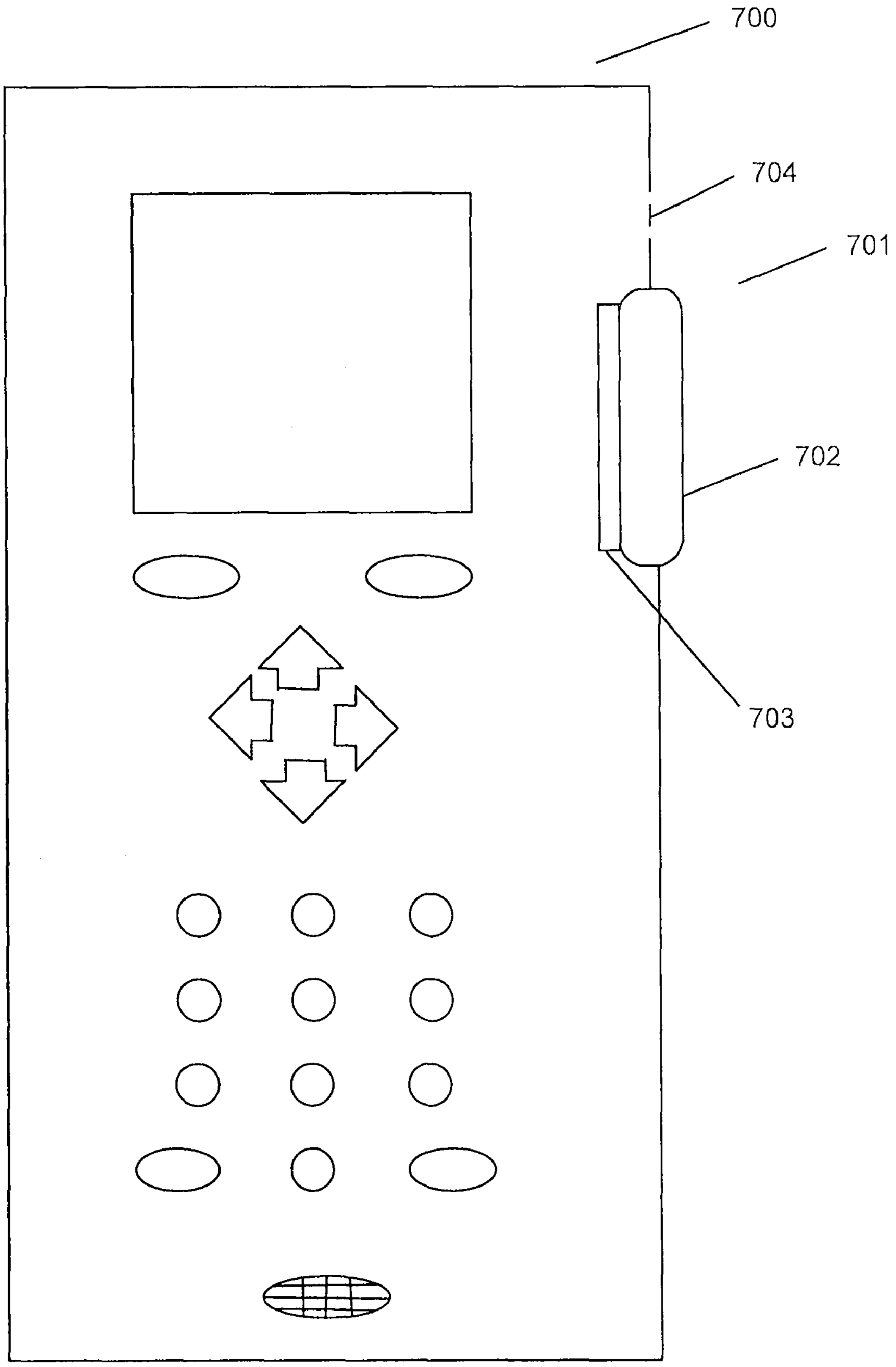
FIG. 7 is a diagram of a portable device including a piezo speaker pressure sensor according to an example embodiment of the present invention.

FIG. 7 shows a diagram of a portable device including a piezo speaker pressure sensor according to an example embodiment of the present invention. In this example embodiment, the portable device may be a cellular phone 700. However, embodiments of the present invention are not limited to a portable device being a cellular phone as any type of portable device may be used in accordance with embodiments of the present invention. For example, a piezo speaker pressure sensor may be incorporated into a portable computer, personal digital assistant, portable game system, portable audio system, or any other portable type device. Although in this embodiment a portable device is shown, a piezo speaker pressure sensor may also be incorporated into any non-portable device.

The portable device 700 may include a piezo speaker pressure sensor 701 integrated into a housing of the portable device 700. The piezo speaker pressure sensor 701 may include a bladder 702 abutted against a piezo speaker element 703. In this example embodiment, the bladder 702 partially extends out from a housing of the portable device 700. The piezo speaker element 703 may be internal to the portable device 700 and when used as a speaker may emit audio sounds that may be heard through holes, a perforation, etc. 704 in a case or housing of the portable device 700. A piezo speaker pressure sensor 701 contained in a portable device 700 may be used for any of many different functions such as, for example, for performing the function of a scale, on/off device, light intensity control, audio volume control, or used as a pressure sensitive input for electronic games or other functions. Although shown on a side of a housing of the portable device 700, a piezo speaker pressure sensor according to embodiments of the present invention may be located anywhere on a portable device.

The block diagrams in the Figures illustrate the architecture, functionality, and operation of possible implementations of systems and methods according to various embodiments of the present invention. It will also be noted that each block of the block diagrams and combinations of blocks in the block diagrams can be implemented by special purpose hardware-based systems which perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although specific embodiments have been illustrated and described herein, those of ordinary skill in the art appreciate that any arrangement which is calculated to achieve the same purpose may be substituted for the specific embodiments shown and that the invention has other applications in other environments. This application is intended to cover any adaptations or variations of the present invention. The following claims are in no way intended to limit the scope of the invention to the specific embodiments described herein.

What is claimed is:

1. A pressure sensor comprising:

a bladder, the bladder functioning as an input device when a pressure is exerted on the bladder thereby causing the bladder to compress;

a piezo speaker element, the bladder abutting the piezo speaker element;

wherein the pressure exerted on the bladder such that the pressure sensed by the piezo speaker element is proportional to the pressure exerted on the bladder in a direction of the piezo speaker element, the amount of pressure sensed by the piezo speaker element determining a type of input; and the piezo speaker element functioning as a speaker when audio signals are received by the piezo speaker element.

2. The pressure sensor according to claim 1, further comprising the bladder having open end, the open end of the bladder abutting the piezo speaker element.

3. The pressure sensor according to claim 1, further comprising the bladder being filled with a volume of air and abutting the piezo speaker element forming an airtight seal.

4. The pressure sensor according to claim 3, further comprising the volume of air in the bladder being one of increased or decreased to tune the piezo speaker element acoustically.

5. The pressure sensor according to claim 1, further comprising the piezo speaker element comprising multiple layers of piezo material.

6. The pressure sensor according to claim 1, further comprising the bladder being filled with one of a porous material, a spongy material, a springy material, an elastic material, a flexible material, or a squishy material.

7. A pressure sensor comprising:

a bladder, the bladder functioning as an input device when a pressure is exerted on the bladder thereby causing the bladder to compress, the bladder not functioning as a sound-generating element;

a piezo speaker element;

a gap between the bladder and the piezo speaker element, the bladder abutting the piezo speaker element via one or more attachments, wherein the pressure is exerted on the bladder such that the pressure sensed by the piezo speaker element is proportional to the pressure exerted on the bladder in a direction of the piezo speaker element, the amount of pressure sensed by the piezo speaker element determining a type of input; and the piezo speaker element functioning as a speaker when audio signals are received by the piezo speaker element.

8. The pressure sensor according to claim 7, further comprising the bladder having open end, the open end of the bladder abutting the piezo speaker element via the one or more attachments.

9. The pressure sensor according to claim 7, further comprising the bladder being filled with a volume of air.

10. The pressure sensor according to claim 9, further comprising the volume of air in the bladder being one of increased or decreased to tune the piezo speaker element acoustically.

11. The pressure sensor according to claim 7, further comprising the piezo speaker element comprising multiple layers of piezo material.

12. The pressure sensor according to claim 7, further comprising the bladder being filled with one of a liquid, a gas, a porous material, a spongy material, a springy material, an elastic material, a flexible material, or a squishy material.

13. A portable device comprising:

a pressure sensor, the pressure sensor comprising:

a bladder, the bladder functioning as an input device when a pressure is exerted on the bladder thereby causing the bladder to compress;

a piezo speaker element, the bladder abutting the piezo speaker element;

a processor, the processor determining a type of input based at least partially on sensing a pressure proportional to a pressure exerted on the bladder in a direction of the piezo speaker element; and an amplifier, the piezo speaker element functioning as a speaker when audio signals are received by the piezo speaker element from the amplifier.

14. The device according to claim 13, further comprising the bladder having open end, the open end of the bladder abutting the piezo speaker element.

15. The device according to claim 13, further comprising the bladder being filled with a volume of air and abutting the piezo speaker element forming an airtight seal.

16. The device according to claim 15, further comprising the volume of air in the bladder being one of increased or decreased to tune the piezo speaker element acoustically.

17. The device according to claim 13, further comprising the piezo speaker element comprising multiple layers of piezo material.

18. The device according to claim 13, further comprising the bladder being filled with one of a liquid, a gas, a porous material, a spongy material, a springy material, an elastic material, a flexible material, or a squishy material.

* * * * *